March 19, 1968 S. J. LINS ET AL 3,373,481

METHOD OF ELECTRICALLY INTERCONNECTING CONDUCTORS

Filed June 22, 1965

INVENTORS
STANLEY J. LINS
RICHARD D. MORRISON

BY Joseph A. Spaldeck
AGENT

United States Patent Office 3,373,481

Patented Mar. 19, 1968

3,373,481

METHOD OF ELECTRICALLY INTERCONNECTING CONDUCTORS

Stanley J. Lins, Minneapolis, and Richard D. Morrison, West St. Paul, Minn., assignors to Sperry Rand Corporation, New York, N.Y., a corporation of Delaware Filed June 22, 1965, Ser. No. 465,943

4 Claims. (Cl. 29—471.3)

ABSTRACT OF THE DISCLOSURE

A technique of securing pedestals to the terminals of integrated circuit elements or devices, allowing the pedestals to make contact with coated substrate interconnect areas of thin-films or printed circuit members, and permitting the pedestals to be dissolved in the coating whereby all pedestals are secured to their matching interconnect areas to effect electrical interconnections.

Integrated circuit packaging is an important consideration in integrated circuit design. The type of package to be utilized often becomes a circuit design decision because of layout and interconnection considerations. Two basic types of hermetically sealed packages currently in use are the can and the flat package having a variety of multiple common-lead configurations. The flat pack permits greater packing densities whereas the can type package is more compatible with discrete-component assemblies.

The design of integrated circuitry involves a number of comprises between many conflicting requirements. First of all, such circuits must be reliable, which means that they must be relatively insensitive to variations in components values due to environmental and aging effects. Also, in order to be able to produce circuits such as these with a reasonable yield, tolerance requirements on circuit components should be as large as possible. The noise immunity of logic circuits should be sufficiently high such that noise signals appearing at various inputs will not result in erroneous operation. Also, a logic circuit should facilitate a high degree of interconnection capability.

Since first and second level interconnections in microcircuit represent potential trouble spots in the equipment using them, new and improved interconnect schemes are of specific current interest. First-level interconnections, occurring normally within the microcircuit package itself, are usually not made by the user with the exception in perhaps hybrid and thin-film circuitry. Second-level interconnections represents the first joining operation external to the microcircuit package. A variety of techniques are used, including solder-brazing, resistance welding, electron-beam welding, laser welding, thermocompression and ultrasonic bonding to mention a few.

At the present stage of technology, the interconnection technique between active integrated circuit devices such as chips and conductive members disposed upon another member, has been achieved by securing a gold wire at one end to the terminal of the active device and at its other end to the conductor or terminating portion thereof on the member on which it is located. This particular type of interconnection is not a reliable interconnection inasmuch as aging and vibration etc., may cause a breakage or electrical shorting of the gold wires which have become detached. An additional inherent disadvantage of the prior art technique, wherein the gold wire is secured to provide the desired interconnection, is the substantial space requirement. In modern digital computers, for example, concentration of circuitry is a requirement which cannot be accommodated by the prior art techniques. Furthermore, low production costs and reliability are absolute essentials. The present invention meets all of these requirements with the additional and expanded capability of accommodating a great number and variety of interconnections.

Another sector of the prior art concerns itself with interconnection schemes between active devices, such as semiconductor chips, and circuit networks disposed upon a separate and independent member. The definition of this interconnection scheme is the "face-down" technique which represents a physical approach appropriate to the terminology used. That is, the chip, for example, is interconnected to the other member, which may be a thin-film member for example, in a face-down manner. The prior art has been restricted in the number of interconnections which can be made between active devices and the circuitry network terminals to which they are to be connected. Currently, more than three interconnections have been achieved, but only with limited success. The inherent disadvantage with such state of development is the fact that surfaces to which the active devices are to be attached, in being limited to three mounting points or interconnect areas, limit the range of capabilities of the combined circuit system. The limitation to three interconnections results from the irregularity of the substrate interconnection surface. Where for example, three points are considered, a geometrical plane can always be defined through same; however, where more than three points are concerned, characteristic irregularities of substrate surface qualities preclude definition of a single plane connecting all four points. The known technology has employed solder-tinned copper spheres as mounting points for three terminal devices. The spheres are sweat soldered to soldered-tinned mounting pads on a circuit member. The technique allows little flexibility because of its limitation to only three interconnections from one active device. The present invention is also directed to overcome these particular difficulties through the use of a novel method and apparatus for effecting electrical interconnections between circuit networks having more or less than three interconnections. The number of interconnections by application of present invention are limited only by physical dimensions of the members themselves.

The present invention, in overcoming the limitations of the prior art, uses pedestals of a suitable metal such as gold formed on each terminal element of an active device by an appropriate method. The gold pedestals may originally take the form of a sphere, for example, and are disposed in a heated vacuum holder means in alignment with the respective terminal portions of the active device. Heat and force are applied to the spheres so as to deform same, and a thermocompression bond is created between the deformed spheres and the terminals of the active device which may be a semiconductor chip, for example. To effect an interconnection scheme between the active device and the thin-film substrate or printed circuit board interconnection area, these portions, at least, of the thin-film substrate or printed circuit board are preferably made of copper by any suitable one of the techniques of the thin-film or printed circuit board fabrication methods. The pedestals are allowed to make contact with solder-tinned interconnect areas of the substrate or printed circuit board. The gold pedestals dissolve in the heated solder until all pedestals come into contact with and are soldered to their interconnect areas. As a result the circuit network adjusts to a particular level and orientation where the multiplicity of bonds will be mated with and be soldered to the interconnect areas. Ultrasonic bonding techniques may be utilized as well as thermocompression techniques.

Accordingly it is a primary object of the present invention to provide an improved method for effecting an electrical interconnection between electrical circuit members.

It is another primary object of the present invention to provide an improved, reliable, low cost, method of establishing electrical interconnection between electrical circuit members.

It is a more specific object of the present invention to provide a method yielding improved electrical interconnection between integrated circuit devices and printed circuit means.

These and other more detailed and specific objects will be disclosed in the course of the following specification, reference being had to the accompanying drawings in which.

Figure 1:
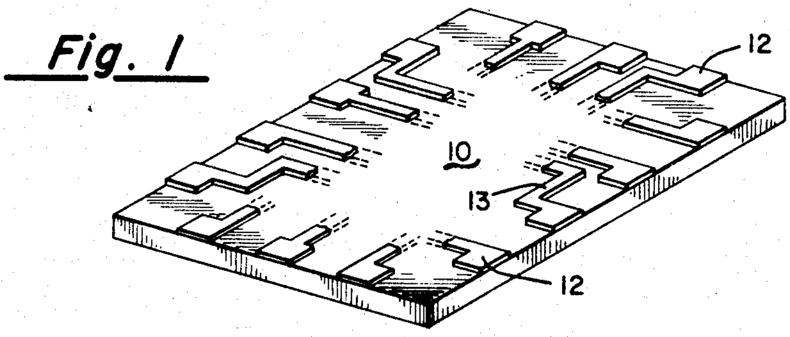
FIGURE 1 is an isometric view of an integrated circuit device.
Figure 2:
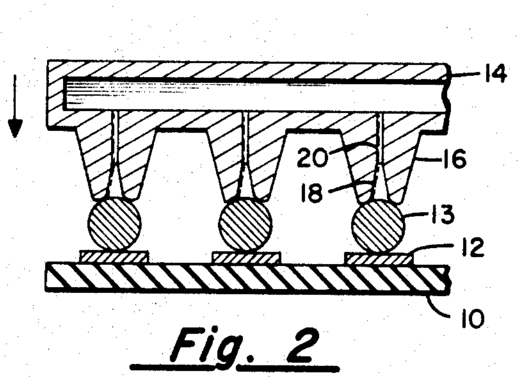
FIGURE 2 illustrates a holder means used to form pedestals on terminal portions of an integrated circuit device.

Referring now to FIGURES 1 and 2, there are illustrated in perspective and in end view, respectively, an integrated circuit device 10 formed, for example, by the semiconductor technique. For sake of clarity, the various diffusion and/or epitaxial layers embedded within the substrate are not shown, but rather only the conductive terminal portions 12 are illustrated. The terminal portions 12 as well as the conductors 13 may be fabricated by processes conventional in the art such as vacuum deposition and are of such material or composition of material to permit thermocompression or ultrasonic bonding of another member thereto. However, there is no intention made to limit the interconnecting implementation technique to solely thermocompression or ultrasonic bonding. Other suitable techniques such as welding may also be satisfactory.

Figure 4:
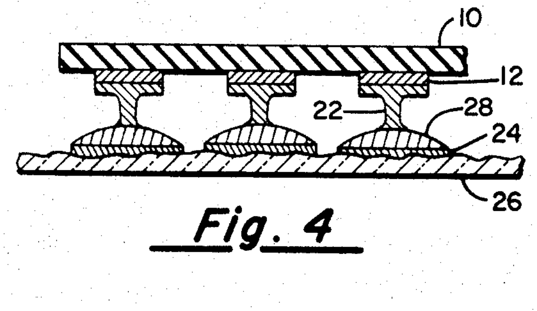
FIGURE 4 illustrates an interconnection of an integrated circuit device with a thin-film substrate or printed circuit board interconnect area utilizing the method and apparatus of the present invention.
Figure 5:
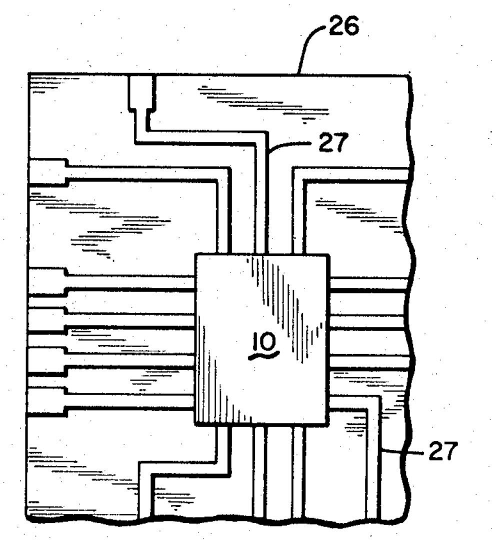
FIGURE 5 illustrates an integrated circuit device interconnected with a plurality of conductive means on a thin-film or printed circuit means.

A vacuum holder 14, illustrated in FIGURE 2, having projecting legs 16 and capable of being heated, is used to apply sufficient force to thermocompress gold spheres 13 to the terminal portions 12. Any suitable arrangement for permitting the vacuum holder to heat the spheres may be utilized, and since the heating arrangement may take a variety of configurations, no further discussion is deemed necessary. Although a heated vacuum holder has been described, the holder could as well represent an ultrasonic bonder. The spheres are maintained partially in recesses 18 by the application of a vacuum through slots 20 from a source (not shown). The terminal portions of circuit device 10 are aligned with the gold spheres such that the downward movement of the vacuum holder and continued application of force thereto causes the spheres to deform in approximate accordance with the geometry of the recesses 18 to form the elongated projecting pedestals and to cause a thermocompression bonding as illustrated in FIGURE 4. There is no intentional limitation that the legs of the vacuum holder be restricted to that illustrated, but rather any design configuration suitable to accomplish the objects of the present invention is satisfactory. The thermocompression bonding process provides a secure mechanical and electrical interconnection between the gold pedestals and the terminal portions 12 of the semiconductor device 10.

Electrical interconnections are not to be limited to those between a semiconductor device and a thin-film device but include any combination of devices between which interconnections are desired. Although the following is not intended to be inclusive of the variety of interconnection plans feasible, a brief sampling is indicated. The interconnections may include those between a semiconductor integrated circuit device and the conductors of a printed circuit board between printed circuit boards, between thin-film substrate members, and so on.

Terminal portions, or pads, or also termed interconnection areas 24 of the thin-film substrate or printed circuit member 26 are fabricated from copper or any other suitable metal. Copper is a preferable material since it is an excellen conductor, is solder wettable, and is not harmed when in contact with lead-tin or silver-copper solder when such are utilized. The elongated conductor portions 27, however, may be fabricated from any suitable conductor such as copper, silver, aluminum, or gold, etc. The substrate 26 is then dipped into a suitable solder mixture. It has been found that with respect to the use of lead-tin solder, that a eutectic mixture of lead-tin is preferable, the eutectic mixture being that ideal mixture of lead and tin which is characterized by the lowest melting temperature as compared to any other proportions of lead-tin mixtures. Lead and tin, themselves, have a higher melting temperature than that which the eutectic mixture exhibits. The advantage of using the lowest possible melting temperature is to reduce the possibility of damage to the thin-film or printed circuit member if the dip-soldering operation is used. As a result of the dip-soldering operation, the solder forms globules or mound-like formations 28 which adhere to the copper terminal portions and to the conductors of the substtrate. A particularly advantageous result of the dip-soldering operation is that the film or layer of solder which adheres to the conductors and interconnection areas influences the electrical conductivity characteristics of same so as to increase it.

Figure 3:
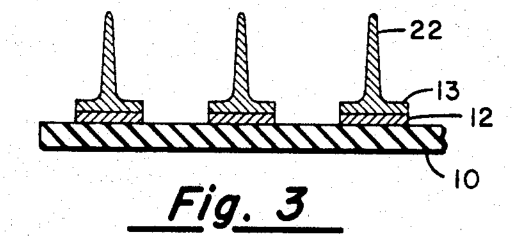
FIGURE 3 illustrates a mounting of the pedestal upon terminals of the circuit device.

After the thermocompression bonding step which leaves the semiconductor device in a condition shown in FIGURE 3, the semiconductor device 10 is flipped over (face-down) so that the gold pedestals 22 may contact with the lead-tin solder formation 28 on the thin-film or printed circuit interconnection area 24.

Sufficient heat is then applied to the substrate to cause the solder formations to exceed their melting temperature, the melting temperature of the lead-tin solder being approximately 183° C. The eutectic temperature of the lead-tin solder is only a fraction of the melting temperature of gold which melts at approximately 1063° C.

When the gold pedestals contact and project into the lead-tin solder formation, a dissolving of the gold into the lead-tin solder occurs. At the eutectic temperature, the solder will dissolve a portion of its own weight of gold. If temperatures of the lead-tin solder are greater than the eutectic temperature, the solder will dissolve a greater percentage of its own weight of gold. When the solder has dissolved the gold into solution, the substrates will adjust automatically to a level and orientation where all the bonds created will meet with and be soldered to the thin-film or printed circuit pads.

As an alternative to the step of reheating the substrate in order to melt the solder formations, the operation may be condensed to a single step by dissolving the gold pedestals into the solder immediately subsequent to the dip-soldering operation. In this manner, advantage of the liquid state of the solder is achieved to eliminate reheating problems.

Although the solder mixture as above described is lead-tin, other mixtures, compounds, or elemental variations thereof would also be satisfactory.

Furthermore, dip-soldering is only one suitable method for coating the conductors and pads. Vacuum deposition methods as well as other suitable methods may also be expeditiously used.

It is understood that suitable modifications may be made in the method and structure as disclosed provided that such modifications come within the spirit and scope of the appended claims. Having now, therefore, fully illustrated and described my invention, what I claim to be new and desire to protect by letters patent is:

What is claimed is:

1. A method of electrically interconnecting conductors of a semiconductor circuit means with thin-film substrate interconnect areas comprising the steps of:

(a) thermocompression bonding gold spherical members to terminals portions of the semiconductor means by the application of heat and force upon said spheres to deform the spheres through the use of a heated vacuum holder means, the vacum holder means being constructed to hold a plurality of the spherical members upon the application of a reduced pressure internally of said holder means;

(b) removing said vacuum holder means subsequent to deformation and bonding of the spherical members to the terminals of the semiconductor device, the deformed spheres being shaped with an elongated projection;

(c) interconnecting said gold projections to the interconnect areas of the thin-film member comprising:

(1) dip-soldering the interconnect areas of the thin-film member to form solder mounds at least upon said areas;

(2) disposing the gold projections into the solder mounds so as to permit dissolving of the gold into the solder whereby electrical interconnections between said semiconductor means and thin-film are effected.

2. The method of claim 1 wherein the solder is a eutectic mixture of lead and tin.

3. The method of claim 1 wherein the solder is a eutectic mixture of silver and copper.

4. The method of electrically interconnecting an integrated circuit semiconductor device with circuitry including interconnect areas contained by another circuit device, the method comprising the steps of:

(a) thermocompression bonding at least four gold spherical members supported by a heated vacuum holding member to a corresponding number of copper terminal portions of the semiconductor device, the bonding by said heated vacuum holding member additionally causing deformation of said gold members to an elongated shape;

(b) dipping said other device into an eutectic mixture of lead-tin solder at least at its melting temperature whereby solder mounds are deposited upon its interconnect areas;

(c) dissolving all the elongated gold members into and by associated solder mounds whereby at least four circuit interconnections are effected between said devices.

References Cited

UNITED STATES PATENTS

| | | | |
|---|---|---|---|
| 2,740,193 | 4/1956 | Pessel | 29—626 X |
| 3,136,032 | 6/1964 | Berndsen | 29—471.7 X |
| 3,252,203 | 5/1966 | Alberts | 29—626 |
| 3,271,555 | 9/1966 | Hirshon | 219—85 |
| 3,271,625 | 9/1966 | Caracciolo. | |
| 3,286,340 | 11/1966 | Kritzler | 29—471.9 X |
| 3,073,006 | 1/1963 | New | 29—589 X |
| 3,075,282 | 1/1963 | McConville | 29—589 X |
| 3,140,527 | 7/1964 | Valdman | 29—590 X |
| 3,292,240 | 12/1966 | McNutt | 29—501 X |
| 3,303,393 | 2/1967 | Hymes | 317—101 |

JOHN F. CAMPBELL, *Primary Examiner.*